(12) United States Patent
Khemka et al.

(10) Patent No.: US 7,550,804 B2
(45) Date of Patent: Jun. 23, 2009

(54) SEMICONDUCTOR DEVICE AND METHOD FOR FORMING THE SAME

(75) Inventors: Vishnu K. Khemka, Chandler, AZ (US); Amitava Bose, Tempe, AZ (US); Todd C. Roggenbauer, Chandler, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 187 days.

(21) Appl. No.: 11/390,796

(22) Filed: Mar. 27, 2006

(65) Prior Publication Data

US 2007/0221967 A1    Sep. 27, 2007

(51) Int. Cl.
*H01L 29/76* (2006.01)
(52) U.S. Cl. ............... 257/341; 257/493; 257/342; 257/E29.024; 438/286
(58) Field of Classification Search ............ 257/342, 257/492, 493, E29.024; 438/286
See application file for complete search history.

(56) References Cited

U.S. PATENT DOCUMENTS

| | | | |
|---|---|---|---|
| 6,724,035 B2 * | 4/2004 | Fujio et al. | 257/493 |
| 6,773,997 B2 * | 8/2004 | Imam et al. | 438/286 |
| 6,777,746 B2 * | 8/2004 | Kitagawa et al. | 257/341 |
| 6,876,035 B2 * | 4/2005 | Abadeer et al. | 257/493 |
| 6,882,023 B2 * | 4/2005 | Khemka et al. | 257/493 |
| 7,023,050 B2 * | 4/2006 | Salama et al. | 257/342 |
| 7,161,209 B2 * | 1/2007 | Saito et al. | 257/341 |
| 2006/0001057 A1 * | 1/2006 | Khemka et al. | 257/280 |

OTHER PUBLICATIONS

Nassif-Khalil et al., "Super Junction LDMOST in Silicon-On-Sapphire Technology (SJ-LDMOST)", ISPSD IEEE, pp. 81-84, 2002.*
Nassif-Khalil et al., "Super Junction LDMOST in Silicon-On-Sapphire Technology (SJ-LDMOST)", ISPSD IEEE, pp. 81-84, 2002.*
Amberetu, Mathew and Salama, Andre, 150-V Class Superjunction Power LDMOS Transistor Switch on SOI, ISPSD pp. 101-104, 2002.

(Continued)

*Primary Examiner*—Walter L Lindsay, Jr.
*Assistant Examiner*—Sun M Kim
(74) *Attorney, Agent, or Firm*—Ingrassia, Fisher & Lorenz, PC

(57) ABSTRACT

A semiconductor device may include a semiconductor substrate having a first dopant type. A first semiconductor region within the semiconductor substrate may have a plurality of first and second portions (44, 54). The first portions (44) may have a first thickness, and the second portions (54) may have a second thickness. The first semiconductor region may have a second dopant type. A plurality of second semiconductor regions (42) within the semiconductor substrate may each be positioned at least one of directly below and directly above a respective one of the first portions (44) of the first semiconductor region and laterally between a respective pair of the second portions (54) of the first semiconductor region. A third semiconductor region (56) within the semiconductor substrate may have the first dopant type. A gate electrode (64) may be over at least a portion of the first semiconductor region and at least a portion of the third semiconductor region (56).

19 Claims, 8 Drawing Sheets

OTHER PUBLICATIONS

Saito, Wataru; Omura, Ichiro; Adia, Satoshi; Semisuperjunction MOSFETs: New Design Concept for Lower On-Resistance and Softer Reverse-Recovey Body Diode, IEEE Transactions on Electron Devices, vol. 50, No. 8, pp. 1801-1806, Aug. 2003.

Nassif-Khalil, Sameh and Salama, Andre, Super Junction, LDMOST in Silicon-On-Sapphire Technology (SJ-LDMOST) ISPSD pp. 81-84, 2002.

* cited by examiner

SEMICONDUCTOR DEVICE AND METHOD FOR FORMING THE SAME

FIELD OF THE INVENTION

The present invention generally relates to a semiconductor device and a method for forming a semiconductor device, and more particularly relates to a high power transistor.

BACKGROUND OF THE INVENTION

Integrated circuits are formed on semiconductor substrates, or wafers. The wafers are then sawed into microelectronic dies (or "dice), or semiconductor chips, with each die carrying a respective integrated circuit. Each semiconductor chip is mounted to a package, or carrier substrate, which is often mounted to a motherboard and installed in various electronic systems.

In recent years, reduced surface field (RESURF) structures have become commonly used in power devices which are often used in power integrated circuits. The RESURF structure is known to provide an improved trade-off between voltage blocking capability and low specific on-resistance for the device when compared to the conventional counterpart. One of the constant ongoing struggles in field of power integrated circuits is to improve this trade-off which enables circuit designers to reduce the size of power devices and thus the size of the overall integrated circuit. Poor voltage blocking performance in a power device is often compounded by the high concentration of dopants used in the various regions of the device, and when a high voltage (e.g., between 80 and 100 volts) is applied to the device, leakage current is dramatically increased due to the enhancement in electric field near the heavily doped junctions. Such current is often referred to as "avalanche" current, and can significantly degrade the power device performance. Typically, any modifications in the device structure to improve its voltage blocking performance almost always results in degradation in its operational on-resistance.

Accordingly, it is desirable to provide a RESURF structure with reduced resistance without adversely affecting the voltage blocking capability of the device. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawings, wherein like numerals denote like elements.

DETAILED DESCRIPTION OF THE INVENTION

The following detailed description is merely exemplary in nature and is not intended to limit the invention or application and uses of the invention. Furthermore, there is no intention to be bound by any expressed or implied theory presented in the preceding technical field, background, brief summary, or the following detailed description. It should also be noted that FIGS. 1-17 are merely illustrative and may not be drawn to scale.

"RdsonA" (drain source on-resistance area) is an important device parameter for power devices, in that RdsonA directly impacts die size and cost. There exists a fundamental trade-off between power device breakdown voltage and RdsonA. Lithography shrink contributes only a small fraction of the RdsonA reduction for high voltage devices. Accordingly, innovative device design techniques need to be employed to have a meaningful size shrink. Current single and double RESURF devices have excellent RdsonA performance for a 25V-55V range. However, the trade-off between power device breakdown voltage and RdsonA must be improved upon to shrink power components. Existing devices are typically designed with a one-to-one (1:1) ratio between drift region length and depth, which does not allow the current to spread uniformly and deep into the drift region. Typically, only about 60-70% of the depth is utilized which does not realize its full RdsonA potential.

Figure 1:
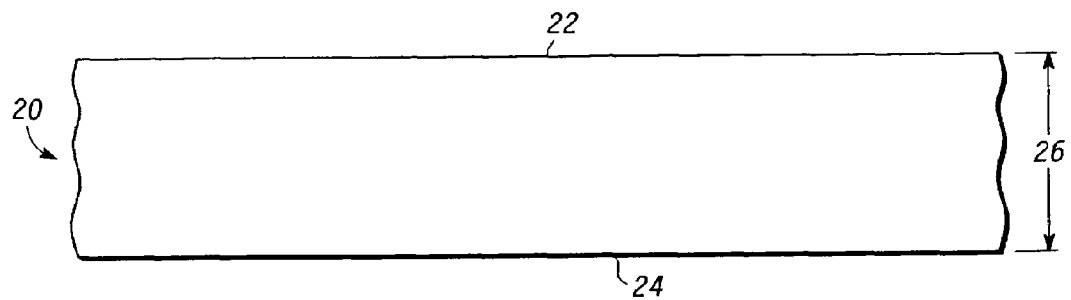
FIG. 1 is a cross-sectional side view of a semiconductor substrate.

According to one embodiment of the present disclosure, a novel power device enables the Rdson current to spread deeper into the drift region and at the same time introduces buried superjunction layers that significantly improve the breakdown voltage and RdsonA (BVdss-RdsonA) trade-off. FIGS. 1-15 illustrate a method for forming a microelectronic assembly, or a semiconductor device, according to one embodiment of the present invention. Referring to FIG. 1, there is illustrated a semiconductor substrate 20. The semiconductor substrate 20 is made of a semiconductor material, such as gallium arsenide (GaAs), gallium nitride (GaN), or silicon (Si). The substrate 20 has upper surface 22, lower surface 24, and a thickness 26 of, for example, between approximately 300 and 1000 microns. The semiconductor material of the substrate 20 may be of a first conductivity type, or doped with a first dopant type, as is commonly understood in the art. In the example illustrated in FIG. 1, the substrate 20 is a "P-type" semiconductor substrate and is doped with boron (B) to a concentration of, for example, approximately $1.0 \times 10^{15}$ atoms per $cm^3$.

Although only a portion of the semiconductor substrate is illustrated, it should be understood that the substrate 20 may be a semiconductor wafer with a diameter of, for example, approximately 150, 200, or 300 millimeters. Additionally, although not specifically illustrated, the substrate 20 may be divided into multiplies dies, or "dice," as commonly understood in the art. Furthermore, although the following process steps may be shown as being performed on only a small portion of the substrate 20, it should be understood that each of the steps may be performed on substantially the entire substrate 20, or multiple dice, simultaneously. Furthermore, although not shown, it should be understood that the processing steps described below may be facilitated by the deposition and exposure of multiple photoresist layers, as is commonly understood.

Figure 2:
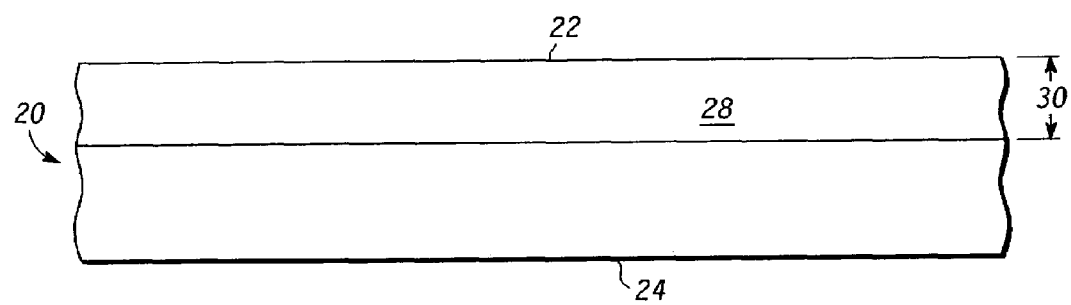
FIG. 2 is a cross-sectional side view of the semiconductor substrate of FIG. 1 with a buried layer formed in an upper surface thereof.

As is illustrated in FIG. 2, a buried layer 28 is first formed in the upper surface 22 of the substrate 20. The buried layer 28 is formed using ion implantation and has a thickness 30 of, for example, between approximately 1 and 2 microns. The ion implantation process changes the semiconductor material of the substrate 20 within the buried layer 28 to have a second conductivity type (i.e., a second dopant type), as is commonly understood. In one embodiment, the buried layer 28 includes "N-type" semiconductor material doped with a relatively high concentration of antimony (Sb) of approximately $1.0 \times 10^{19}$ atoms per $cm^3$.

Figure 3:
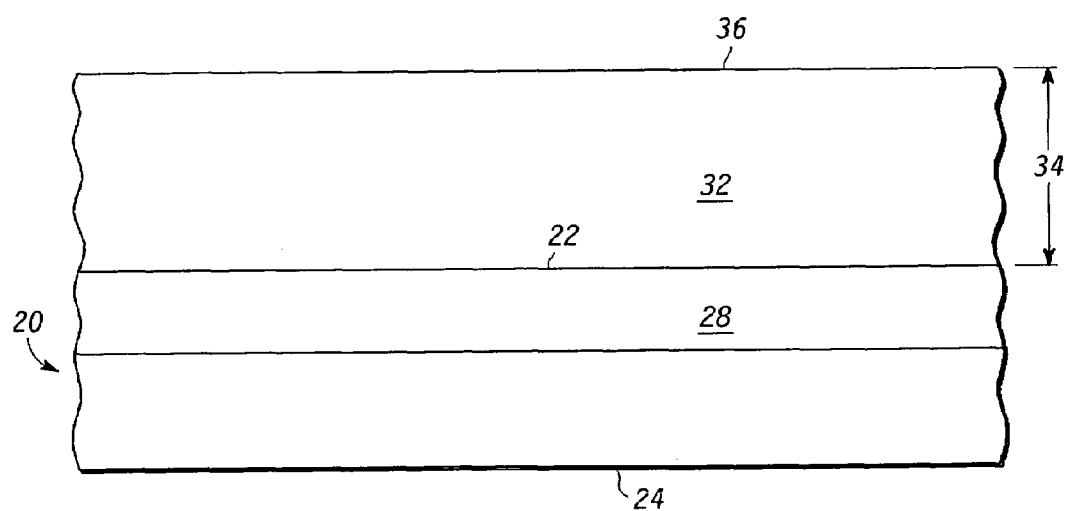
FIG. 3 is a cross-sectional side view of the semiconductor substrate of FIG. 2 with an epitaxial layer formed thereon.

As shown in FIG. 3, an epitaxial layer 32 is then grown on the upper surface 22 of the substrate 20. The epitaxial layer 32 may have a thickness 34 of, for example, between 2 and 5 microns, and the semiconductor material of the epitaxial layer 32 may have the first conductivity type (i.e., P-type). In one embodiment of the present invention, the epitaxial layer 32 is doped with boron to a concentration of, for example, approximately $1.0 \times 10^{15}$ atoms per $cm^3$. The epitaxial layer 32 may also have an upper surface 36.

Figure 4:
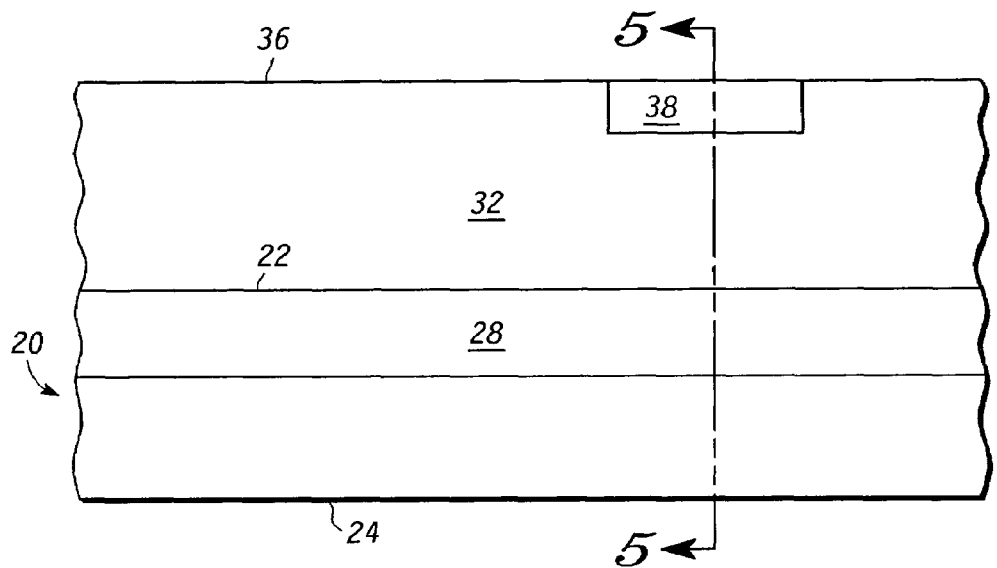
FIG. 4 is a cross-sectional side view of the semiconductor substrate of FIG. 3 with an isolation region formed thereon.
Figure 5:
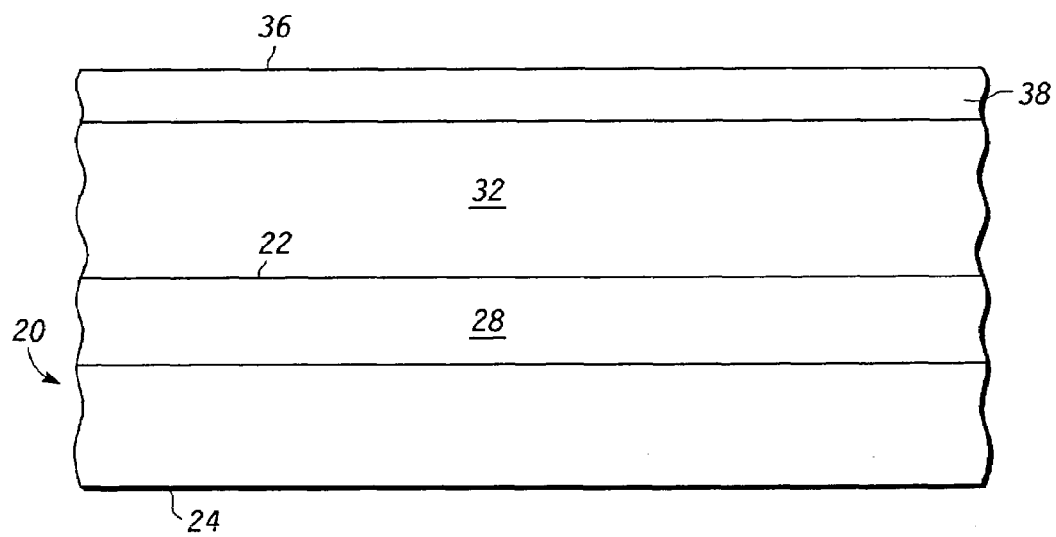
FIG. 5 is a cross-sectional side view of the semiconductor substrate of FIG. 4 taken along line 5-5.

Referring to FIGS. 4 and 5, a shallow trench isolation (STI) region 38 is then formed on, or in, the upper surface 36 of the epitaxial layer 32. As is commonly understood in the art, the STI region 38 may be formed by etching a trench into the upper surface 36 of the epitaxial layer 32 and filling the trench with an insulating material, such as a field oxide. The STI region 38 may have a thickness of, for example, between 0.3 and 1 micron. The width of the STI region may be appropriately adjusted depending on the voltage requirements of the semiconductor device, as is commonly understood, and is typically between 0.5 and 5 microns. As shown specifically in FIG. 5, the STI region 38 may extend across the epitaxial layer 32.

Figure 6:
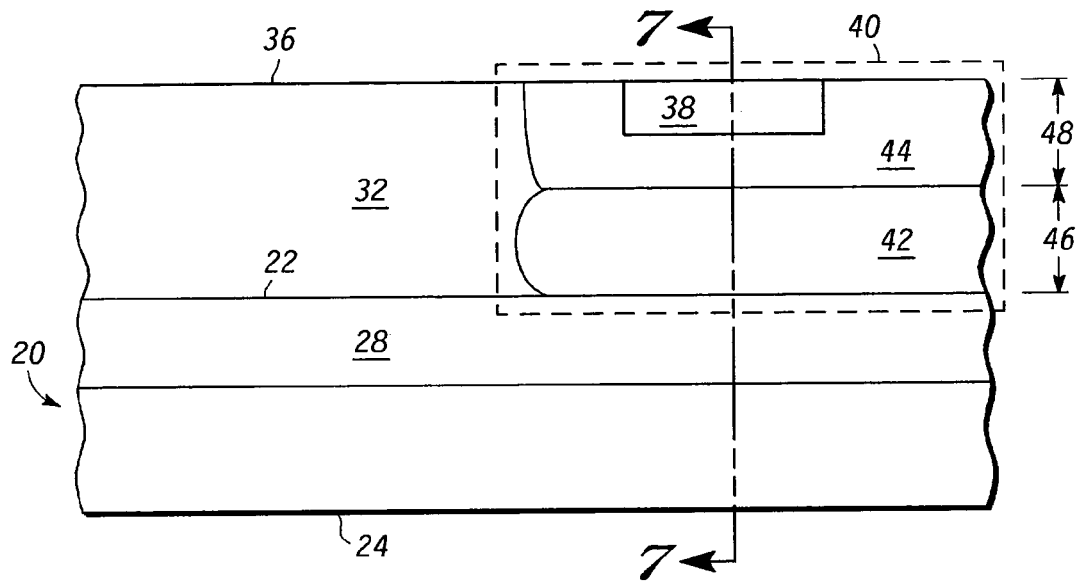
FIG. 6 is a cross-sectional side view of the semiconductor substrate of FIG. 4 with a plurality of high voltage wells formed in the epitaxial layer.
Figure 7:
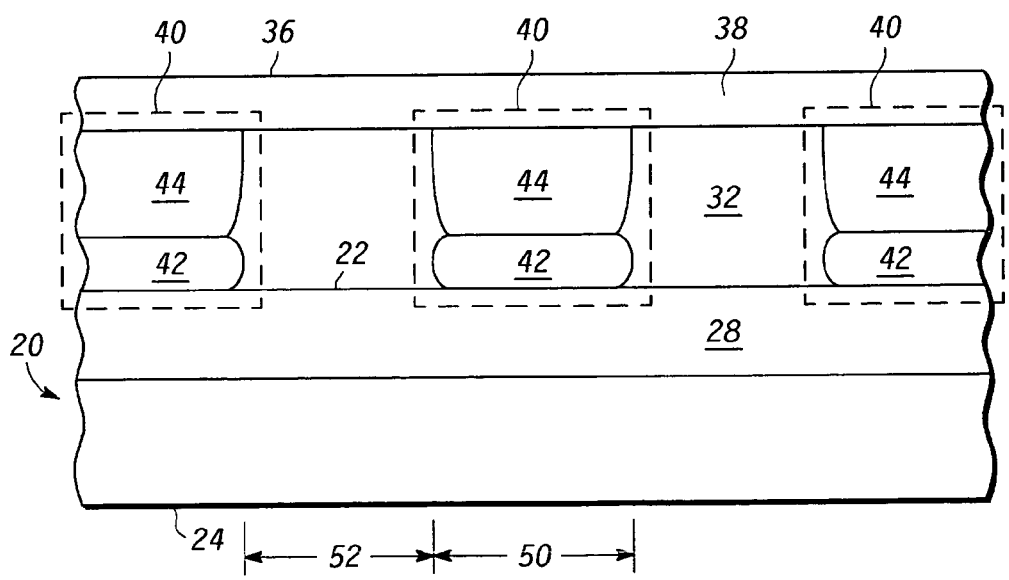
FIG. 7 is a cross-sectional side view of the semiconductor substrate of FIG. 6 taken along line 7-7.

Next, as shown in FIGS. 6 and 7, a plurality of high voltage wells 40 are formed within the epitaxial layer 32 adjacent to and below the STI region 38. In an exemplary embodiment, the high voltage wells 40 are formed using ion implantation and include a P-type region 42 and an N-type drift region 44.

The P-type regions 42 are adjacent to the buried layer 28 and are doped with, for example, boron with a concentration of, for example, between $2.0 \times 10^{16}$ atoms per $cm^3$ and $6.0 \times 10^{16}$ atoms per $cm^3$ to have the first conductivity type. The P-type regions 42 may have a thickness 46 of approximately 1.5 microns. The N-type drift regions 44 may be located directly above the P-type region 42 in the same high voltage well 40, extend to the upper surface 36 of the epitaxial layer 32, and surround the STI region 38, as illustrated in FIG. 6. The N-type drift region 44 may be doped with, for example, phosphorous (P) to a concentration of, for example, between $5.0 \times 10^{16}$ and $8.0 \times 10^{16}$ atoms per $cm^3$. The N-type drift region 44 may have a thickness 48 of approximately 1.5 microns. As shown in FIG. 7, the high voltage wells 40 may have widths 50 of, for example, between 1.5 and 3 microns and be spaced throughout the epitaxial layer 32 in the same direction in which the STI region 38 extends and separated by a distance 52 of, for example, between 1 and 2 microns. Although not specifically illustrated, the P-type regions 42 and the N-type drift regions 44 may be formed during one processing step (i.e., using only one layer of photoresist), as will be appreciated by one skilled in the art.

Figure 8:
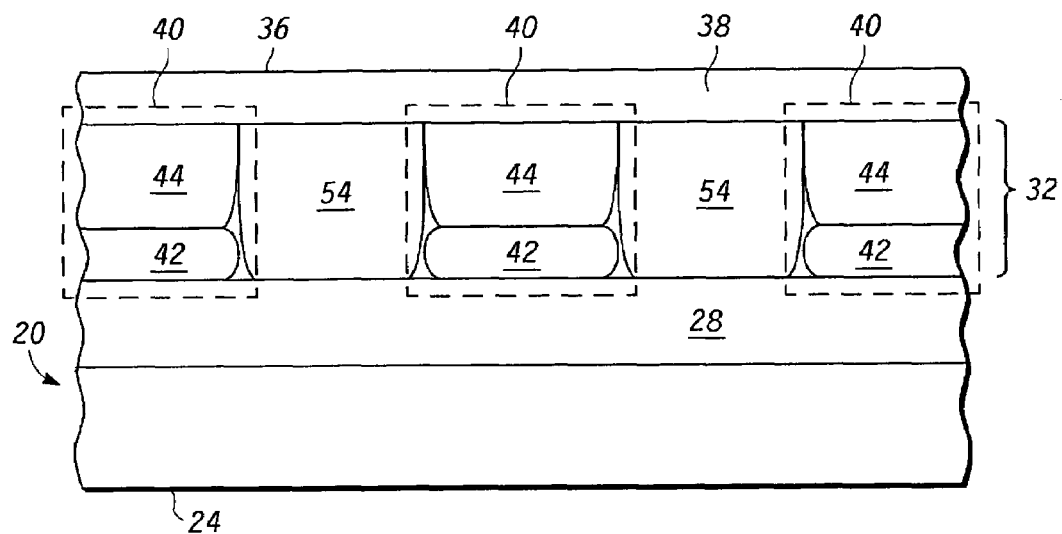
FIG. 8 is a cross-sectional side view of the semiconductor substrate of FIG. 7 with a plurality of extension regions formed between the high voltage wells.

As shown in FIG. 8, a plurality of N-drift extensions, or extension regions, 54 are then formed within the epitaxial layer 32 between the high voltage wells 40. The N-drift extensions 54 are formed using ion implantation and may be doped with, for example, phosphorous (P) to a concentration of, for example, between $5.0 \times 10^{16}$ and $8.0 \times 10^{16}$ atoms per $cm^3$ to have the second conductivity type. Each N-drift extension 54 may be adjacent to and laterally between both the P-type regions 42 and the N-type drift regions 44 in a respective pair of the high voltage wells 40. Although not specifically illustrated, the N-drift extensions 54 and the N-type drift regions 44 of the high voltage wells may jointly form a first semiconductor region, all of which may have the second conductivity type. Thus, the first semiconductor region essentially covers the P-type regions 42 from above and both sides and forms buried "super-junction" (or a buried super-junction).

Figure 9:
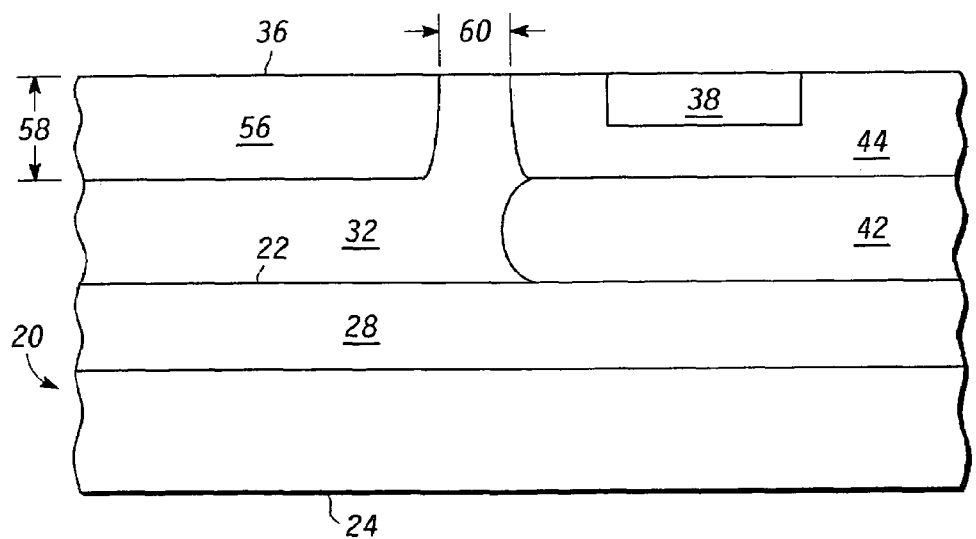
FIG. 9 is a cross-sectional side view of the semiconductor substrate of FIG. 6 with a body region formed in the epitaxial layer.

Referring now to FIG. 9, a body region 56 (e.g., P-body) is next formed in the upper surface 36 of the epitaxial layer 32. The body region 56 may also be formed using ion implantation and have the first conductivity type. The body region 56 may be doped with boron to a concentration of, for example, approximately $2.0 \times 10^{17}$ atoms per $cm^3$. The body region 56 may have a thickness 58 of approximately 1.6 microns and be positioned such that a gap 60 of approximately 0.2 microns lies between the body region 56 and the N-type drift regions 44 across the upper surface 36 of the epitaxial layer 32.

Figure 10:
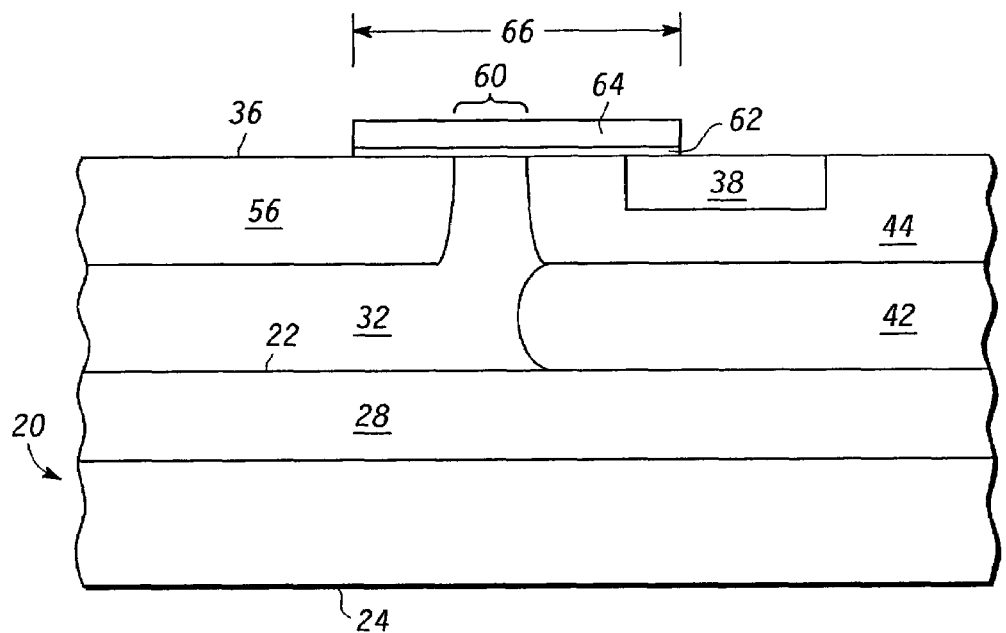
FIG. 10 is a cross-sectional side view of the semiconductor substrate of FIG. 9 with a gate dielectric and a gate electrode formed on the upper surface thereof.

Referring to FIG. 10, a gate dielectric 62 and a gate electrode 64 are formed on the upper surface 36 of the epitaxial layer 32. As shown, the gate dielectric 62 and the gate electrode 64 may lie across the gap 60 between the body region 56 and the N-type drift regions 44 to partially cover the body region 56, the N-type drift regions 44, and the STI region 38. The gate dielectric 62 is made of an insulating material, such as silicon oxide, and has a thickness of, for example, approximately 300 angstroms. The gate electrode 64, in one embodiment, is made of poly-silicon and has a thickness of approximately 0.2 microns. The gate electrode 64 has a gate length 66 of, for example, approximately 2.5 microns.

Figure 11:
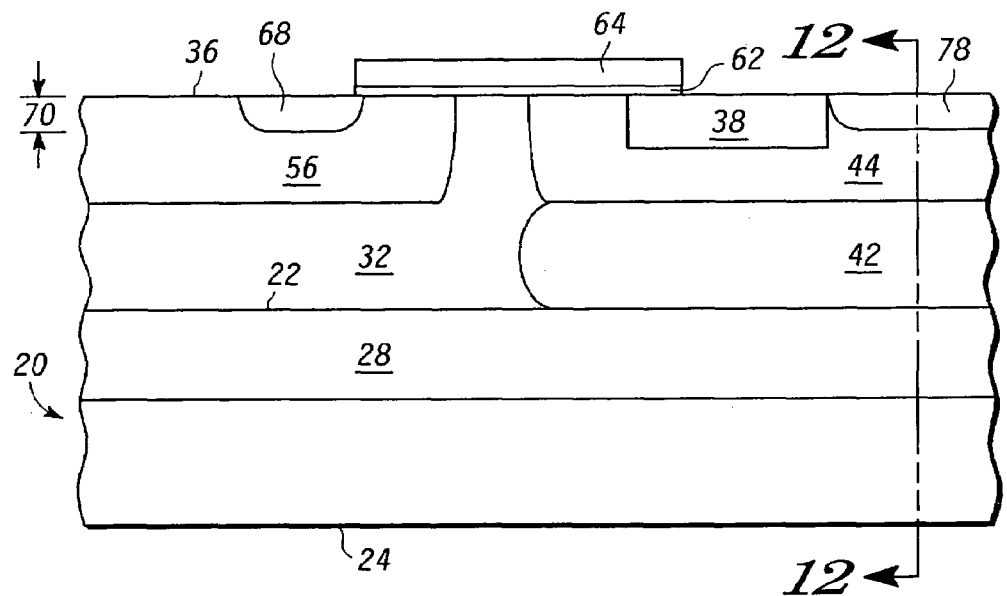
FIG. 11 is a cross-sectional side view of the semiconductor substrate of FIG. 10 with a source contact region and a drain contact region formed in the upper surface thereof.

Next, as illustrated in FIG. 11, a source contact region 68 is formed within the body region 56. As illustrated, the source contact region 68 is located at the surface 36 of the epitaxial layer 32 and adjacent to the gate dielectric 62. The source contact region 68 may have a thickness 70 of, for example, between approximately 0.1 and 1 microns. The source contact region may also be formed using ion implantation and have N-type conductivity, being doped with phosphorous having a concentration of, for example, between $1.0\times10^{16}$ atoms per cm$^3$ and $1.0\times10^{18}$ atoms per cm$^3$.

Figure 12:
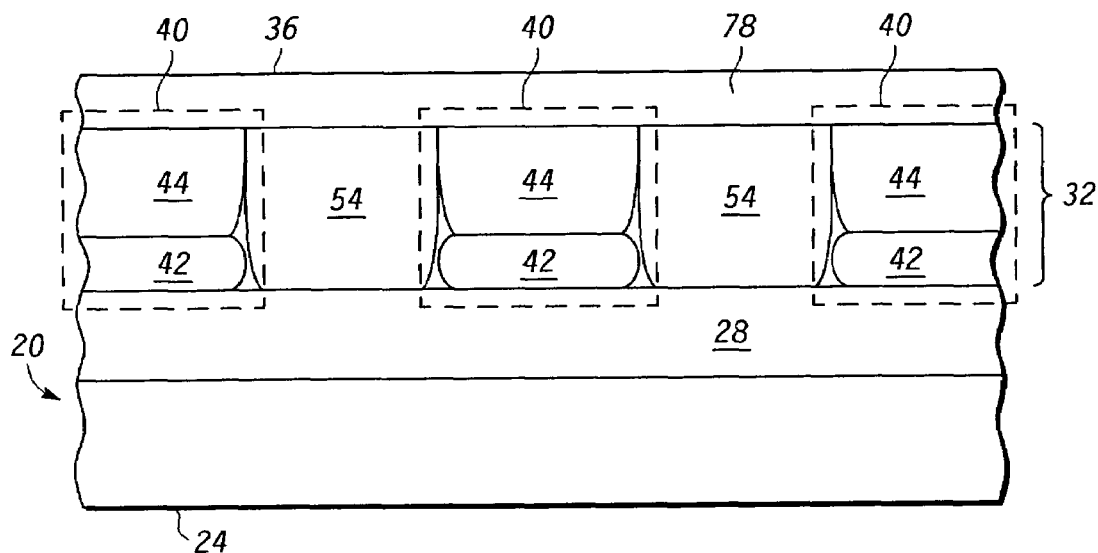
FIG. 12 is a cross-sectional side view of the semiconductor substrate of FIG. 11 taken along line 12-12.

Referring to FIG. 11, in combination with FIG. 12, at the same time the source contact region 68 is formed, a drain contact region 78 is formed in the upper surface 36 of the epitaxial layer 32 across the high voltage wells 40 and the N-drift extensions 54 and adjacent to the STI region 38 on a side thereof opposing the gate electrode 64. The drain contact region 78 may also be formed using ion implantation, have N-type conductivity, and include, for example, phosphorous ions with a concentration of approximately $1.0\times10^{20}$ atoms per cm$^3$.

Figure 13:
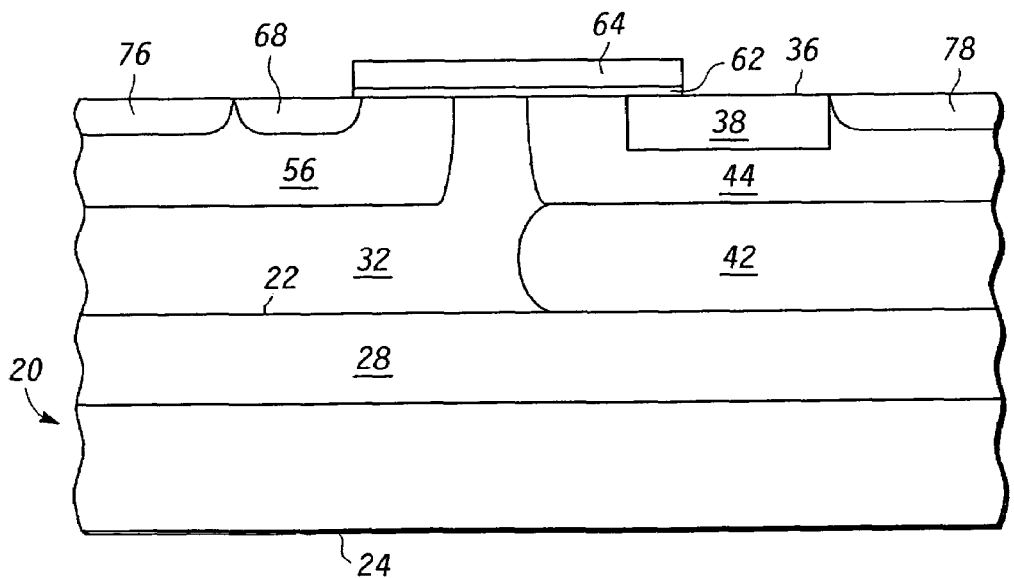
FIG. 13 is a cross-sectional side view of the semiconductor substrate of FIG. 11 with a body contact region formed within the body region and a drain contact region formed within the high voltage wells and the extension regions.

As shown in FIG. 13, a body contact region 76 is then formed in the upper surface 36 of the epitaxial layer 32. As shown, the contact region 76 is formed within the body region 56 and adjacent to the source contact region 68. The body contact region 76 has a thickness similar to the source contact region 68. The body contact region 76 may be formed using ion implantation and may include boron ions with a concentration of, for example, approximately $1.0\times10^{20}$ atoms per cm$^3$, to have a P-type conductivity.

The formation of the source, drain, and body contact regions 68, 78, and 76, respectively, may substantially complete the formation of a RESURF structure, as is commonly understood in the art. As will be also appreciated by one skilled in the art, the high voltage wells 40 and the body region 56 are often disposed back-to-back in a repeating pattern for a large area device. Additionally, other components, such as well regions and other contact regions may be included in the formation of the device, although not shown or described in detail.

Figure 14:
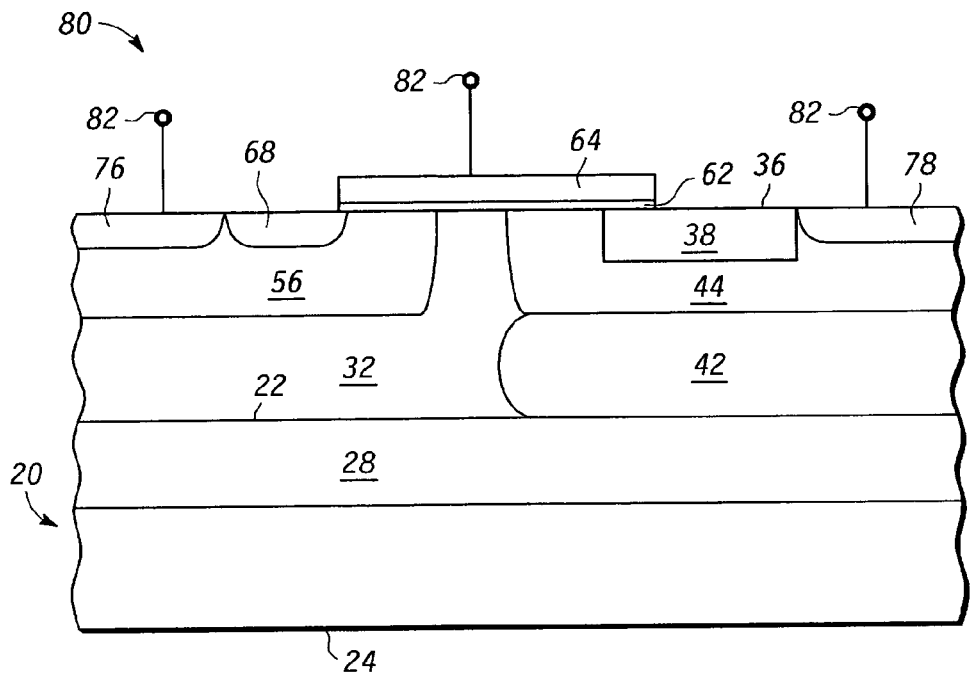
FIG. 14 is a cross-sectional schematic view of the semiconductor substrate of FIG. 13 illustrating electrical connections being made to the source and drain contact regions and the gate electrode.
Figure 15:
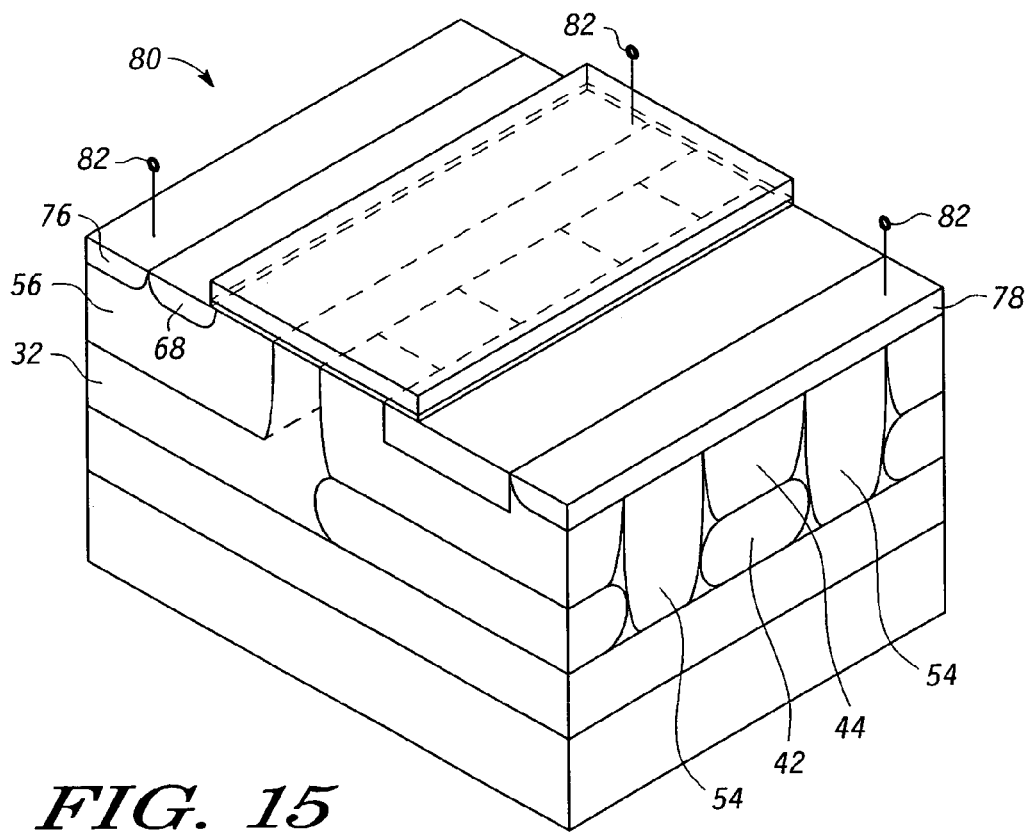
FIG. 15 is a cross-sectional isometric view of the semiconductor substrate of FIG. 14 illustrating a semiconductor device according to one embodiment of the present invention.

After final processing steps, including the formation of silicide regions over the source contact region 68 and the drain contact region 78, the substrate 20 may be sawed into individual microelectronic dice, or semiconductor chips, packaged, and installed in various electronic or computing systems. It is a common practice in the art to form a single silicide region over source contact region 68 and body contact region 76 so as to electrically short them together, in order to improve the robustness of the device. As illustrated in FIGS. 14 and 15, which illustrate a semiconductor device 80 (or microelectronic assembly) according to one embodiment of the present invention, electrical connections 82 are made to the source and body contact regions 68 and 76, the drain contact region 78, and the gate electrode 64. During operation, because of the structure of the semiconductor device, particularly the high voltage wells 40 and the N-drift extensions, current spreads deeper into the device as it passes from the source contact region to the drain contact region.

Thus, according to one embodiment, a high voltage N-well (HVNW) implant includes a buried P-layer below the high voltage N-well portion, wherein the P-layer portion may be self-aligned in the same implant chain as the HVNW implant. In addition, a heavily doped buried layer (e.g., an n-type buried layer (NBL)) is provided below the semiconductor device which enhances its resurf action. In another embodiment, the heavily doped buried layer is tied to the drain of the device through external metallization (not shown). In a third dimension, the HVNW layer is striped and a separate N-drift extension (i.e., NEXT) implant is added which is deeper than HVNW, wherein the separate N-drift extension does not have the P- layer below it. Alternatively, a uniform HVNW can be implanted and a separate buried P-implant can be added in the form of stripes in the third dimension. As a result, a buried superjunction layer is created with alternate N and P layers. Having a deep NEXT implant in-between and that goes as deep as the NBL, allows for current to spread deeper into the drift region cross-section and thus improves the Rds on -resistance of the device.

One advantage of the semiconductor device described above is that because of the buried super-junctions current is more widely and evenly distributed through the device during operation. Therefore, the resistance of the device is reduced without negatively affecting the breakdown voltage of the device.

Figure 16:
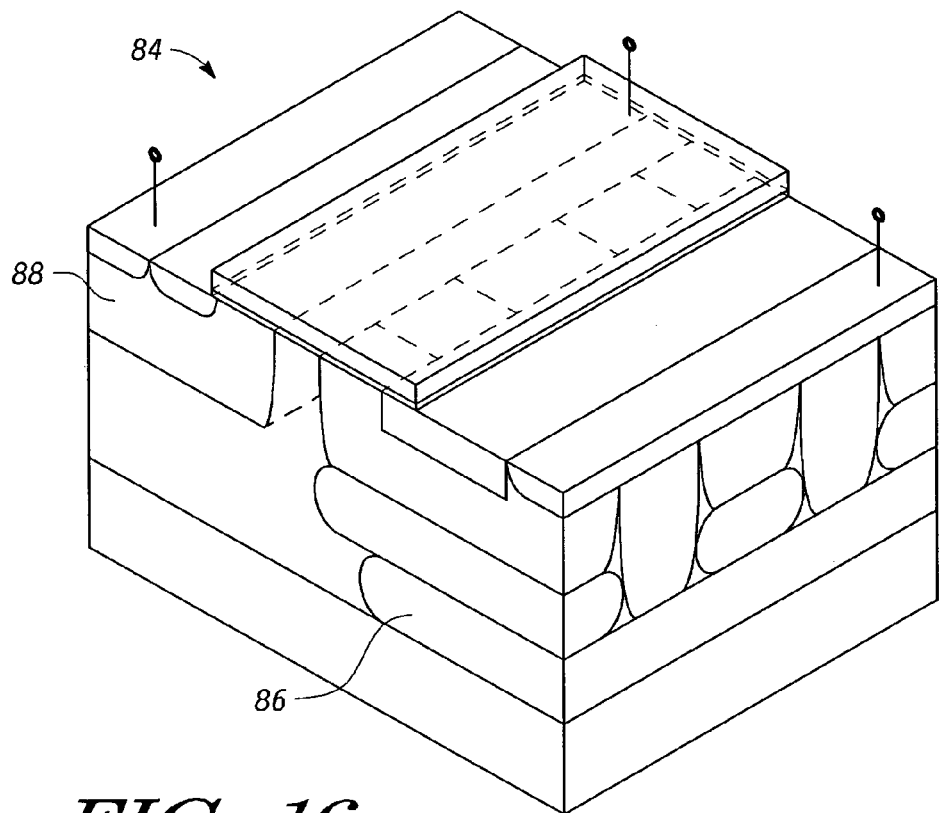
FIG. 16 is a cross-sectional isometric view of a semiconductor device according to another embodiment of the present invention.

FIG. 16 illustrates a semiconductor device 84 according to another embodiment of the present invention. In the semiconductor device 84, unlike the embodiment illustrated in FIGS. 1-15, the buried layer 86 extends only partially across the device 84 and does not reach the portion of the device 84 below the body region 88. Thus, a high voltage N-well (HVNW) implant includes a buried P-layer below the high voltage N-well portion, wherein the P-layer portion may be self-aligned in the same implant chain as the HVNW implant. In addition, a heavily doped buried layer (e.g., an n-type buried layer (NBL)) is provided only below the device drift region to enhance the device resurf action. In a third dimension, the HVNW layer is striped and a separate N-drift extension (i.e., NEXT) implant is added which is deeper than HVNW, wherein the separate N-drift extension does not have the P-layer below it. Alternatively, a uniform HVNW can be implanted and a separate buried P-implant can be added in the form of stripes in the third dimension. As a result, a buried superjunction layer is created with alternate N and P layers. Having a deep NEXT implant in-between and that goes as deep as the NBL, allows for current to spread deeper into the drift region cross-section and thus improves the Rds on-resistance of the device.

Figure 17:
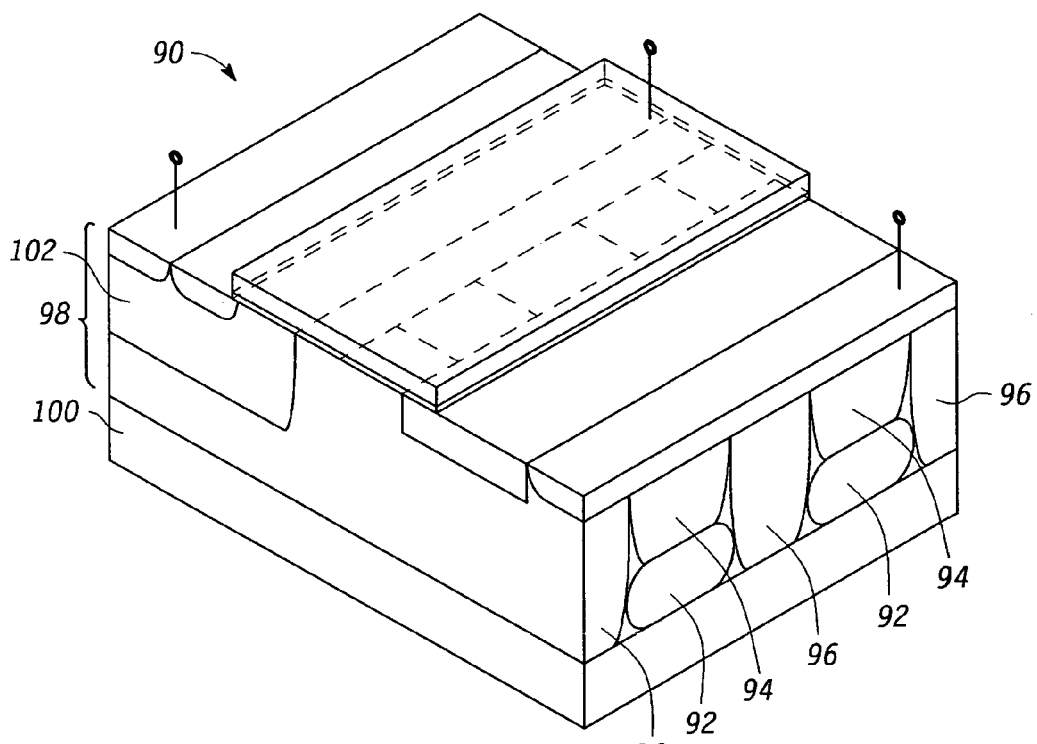
FIG. 17 is a cross-sectional isometric view of the semiconductor device according to a further embodiment of the present invention.

FIG. 17 illustrates a semiconductor device 90 according to a further embodiment of the present invention. Of particular interest is that the device 90 does not contain a buried layer. Rather, the P-type regions 92, the N-type drift regions 94, and the N-drift extensions 96 have been formed within an expitaxial layer 98 that is grown directly on a P-type substrate 100. As shown, the N-drift extensions 96 extend to contact the P-body 102. Thus, a high voltage N-well (HVNW) implant includes a buried P-layer below the high voltage N-well portion, wherein the P-layer portion may be self-aligned in the same implant chain as the HVNW implant. In this embodiment, a heavily doped buried layer (e.g., an n-type buried layer (NBL)) is not provided. In a third dimension, the HVNW layer is striped and a separate N-drift extension (i.e., NEXT) implant is added which is deeper than HVNW. Alternatively, a uniform HVNW can be implanted and a separate buried P-implant can be added in the form of stripes in the third dimension. As a result, a buried superjunction layer is created with alternate N and P layers. Having a deep NEXT implant in-between and that goes deeper than the HVNW, allows for current to spread deeper into the drift region cross-section and thus improves the Rds on -resistance of the device.

Other embodiments may utilize different dopants at different concentrations. Although the description above refers to P-type as being the first dopant and conductivity type and N-type as being the second dopant and conductivity type, it should be understood that the dopant types of the various regions may be switched, as is commonly understood in the art.

The invention provides a semiconductor device. The semiconductor device may comprise a semiconductor substrate having a first dopant type. A first semiconductor region within the semiconductor substrate may have a plurality of first and second portions. The first portions may have a first thickness, and the second portions may have a second thickness. The first semiconductor region may have a second dopant type. A plurality of second semiconductor regions within the semiconductor substrate may each be positioned at least one of directly below and directly above a respective one of the first portions of the first semiconductor region and laterally between a respective pair of the second portions of the first semiconductor region. A third semiconductor region within the semiconductor substrate may have the first dopant type. A gate electrode may be over at least a portion of the first semiconductor region and at least a portion of the third semiconductor region. The plurality of second semiconductor regions disposed laterally between the second portions of the first semiconductor regions may form a buried super-junction.

Each respective first portion of the first semiconductor region may be positioned laterally between the respective pair of the second portions of the first semiconductor region. Each respective first portion of the first semiconductor region may be adjacent to the respective pair of the second portions of the first semiconductor region. Each second semiconductor region may be adjacent to the respective first portion of the first semiconductor region and the respective pair of the second portions of the first semiconductor region. Each second semiconductor region may be positioned directly below the respective first portion of the first semiconductor region.

The semiconductor device may further comprise a source contact region within the semiconductor substrate and adjacent to the third semiconductor region. The source contact region may have the second dopant type. The semiconductor device may further comprise a drain contact region within the semiconductor substrate and adjacent to the first semiconductor region. The drain contact region may have the second dopant type.

The semiconductor device may further comprise a fourth semiconductor region within the semiconductor substrate and adjacent to the third semiconductor region. The fourth semiconductor region may have the first dopant type.

The gate electrode may be adjacent to and on a side of the source contact region opposing the fourth semiconductor region. The first dopant type may be P-type, and the second dopant type may be N-type.

Another embodiment of the invention provides a semiconductor device. The semiconductor device may comprise a first semiconductor layer having a first dopant type, a second semiconductor layer over the first semiconductor layer having a second dopant type, and a third semiconductor layer over the second semiconductor layer. A first semiconductor region within the third semiconductor layer may have first, second, and third portions and the second dopant type. A second semiconductor region within the third semiconductor layer may be between the first semiconductor region and the second semiconductor layer and have the first dopant type. The first and second semiconductor regions may be shaped and positioned such that the first and second portions of the first semiconductor region lie on laterally opposing sides of the second semiconductor region and the third portion of the first semiconductor region is at least one of directly below and directly above the second semiconductor region. A third semiconductor region within the third semiconductor layer may be above the second semiconductor region and have the first dopant type. A fourth semiconductor region may be within the third semiconductor layer adjacent to the third semiconductor region and have the first dopant type. A source contact region may be within the third semiconductor layer adjacent to the third semiconductor region and adjacent to the fourth semiconductor region and have a second concentration of the second dopant type. A drain contact region may be within the third semiconductor layer and adjacent to the first semiconductor region and have the second dopant type. A gate electrode may be over at least a portion of the first semiconductor region and at least a portion of the third semiconductor region and adjacent to and on a side of the source contact region opposing the fourth semiconductor region. The second semiconductor region disposed laterally between the first and second portions of the first semiconductor region may form a buried super-junction.

The first, second, and third portions of the first semiconductor region may be adjacent to the second semiconductor region. The third portion of the first semiconductor region may be directly above the second semiconductor region. The third portion of the first semiconductor region may be adjacent to the first and second portions of the first semiconductor region. The first dopant type may be P-type, and the second dopant type may be N-type.

The invention also provides a method for constructing a semiconductor device. A first semiconductor region may be formed in a semiconductor substrate having a first dopant type. The first semiconductor region may have a plurality of first and second portions. The first portions may have a first thickness, and the second portions may have a second thickness. The first semiconductor region may have a second dopant type. A plurality of second semiconductor regions may be formed within the semiconductor substrate. Each second semiconductor region may be positioned at least one of directly below and directly above a respective one of the first portions of the first semiconductor region and laterally between a respective pair of the second portions of the first semiconductor region. A third semiconductor region may be formed within the semiconductor substrate and have the first dopant type. A gate electrode may be formed over at least a portion of the first semiconductor region and at least a portion of the third semiconductor region. The plurality of second semiconductor regions disposed laterally between the second portions of the first semiconductor regions may form a buried super-junction.

Each respective first portion of the first semiconductor region may be positioned laterally between and adjacent to the respective pair of the second portions of the first semiconductor region. Each second semiconductor region may be adjacent to the respective first portion of the first semiconductor region and the respective pair of the second portions of the first semiconductor region.

The method may further comprise forming a source contact region within the semiconductor substrate and adjacent to the third semiconductor region. The source contact region may have the second dopant type. The method may further comprise forming a drain contact region within the semiconductor substrate and adjacent to the first semiconductor region. The drain contact region may have the second dopant type. The first dopant type may be P-type and the second dopant type may be N-type.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor device comprising:
a semiconductor substrate having a first dopant type;
an epitaxial layer on an upper surface of the semiconductor substrate;
a first semiconductor region within the epitaxial layer and having a plurality of first portion and second portions that are laterally adjacent to the first portions, the first portions having a first thickness and the second portions having a second thickness that is greater than the first thickness, the first semiconductor region having a first concentration of a second dopant type;
a plurality of second semiconductor regions within the epitaxial layer, each second semiconductor region being positioned directly below one of the first portions of the first semiconductor region and laterally between a respective pair of the second portions of the first semiconductor region, the second semiconductor regions having the first dopant type;
a contact region within and at a surface of the epitaxial layer and adjacent to the first semiconductor region, the contact region having a second concentration of the second dopant type, the second concentration being substantially different than the first concentration;
the third semiconductor region within the epitaxial layer, the third semiconductor region having the first dopant type; and
a gate electrode over at least a portion of the first semiconductor region and at least a portion of the third semiconductor region, wherein the first semiconductor region covers the plurality of second semiconductor regions to form a buried super-junction.

2. The semiconductor device of claim 1, wherein each respective first portion of the first semiconductor region is positioned laterally between the respective pair of the second portions of the first semiconductor region.

3. The semiconductor device of claim 2, wherein each respective first portion of the first semiconductor region is adjacent to the respective pair of the second portions of the first semiconductor region.

4. The semiconductor device of claim 3, wherein each second semiconductor region is adjacent to the respective first portion of the first semiconductor region and the respective pair of the second portions of the first semiconductor region.

5. The semiconductor device of claim 1, wherein the contact region is a drain contact region and the semiconductor device further comprising a source contact region within the epitaxial layer and adjacent to the third semiconductor region, the source contact region having a second dopant type.

6. The semiconductor device of claim 5, wherein the drain contact region extends directly above at least some of the first portions of the semiconductor region and the respective second semiconductor regions.

7. The semiconductor device of claim 6, further comprising a fourth semiconductor region within the semiconductor substrate and adjacent to the third semiconductor region, the fourth semiconductor region having the first dopant type.

8. The semiconductor device of claim 7, wherein the gate electrode is laterally disposed to one side of the source contact region opposite the fourth semiconductor region.

9. The semiconductor device of claim 8, wherein the first dopant type is P-type and the second dopant type is N-type.

10. A semiconductor device comprising:
a first semiconductor layer having a first dopant type;
a second semiconductor layer over the first semiconductor layer, the second semiconductor layer having a second dopant type;
an epitaxial layer over the second semiconductor layer;
a first semiconductor region within the epitaxial layer, the first semiconductor region having first, second, and third portions and a first concentration of the the second dopant type, wherein the first, second, and third portions are laterally adjacent to each other, and wherein the third portion has a thickness that is less than the thickness of the first and second portions;
a second semiconductor region within the epitaxial layer between the first semiconductor region and the second semiconductor layer, the second semiconductor region having the first dopant type, wherein the first and second semiconductor regions are shaped and positioned such that the first and second portions of the first semiconductor region lie on laterally opposing sides of the second semiconductor region and the third portion of the first semiconductor region is directly above the second semiconductor region;
a third semiconductor region within the epitaxial layer above the second semiconductor region, the third semiconductor region having the first dopant type;
a fourth semiconductor region within the epitaxial layer adjacent to the third semiconductor region, the fourth semiconductor region having the first dopant type;
a source contact region within the epitaxial layer adjacent to the third semiconductor region and adjacent to the fourth semiconductor region, the source contact region having a second concentration of the second dopant type;
a drain contact region within the epitaxial layer and adjacent to the first semiconductor region and above the second semiconductor region, the drain contact region having a second concentration of the second dopant type, the second concentration being substantially different than the first concentration; and
a gate electrode over at least a portion of the first semiconductor region and at least a portion of the third semiconductor region, the gate electrode being laterally disposed to one side of the source contact region opposite the fourth semiconductor region, wherein the second semiconductor region is disposed laterally between the first and second portions of the first semiconductor region to form a buried super-junction.

11. The semiconductor device of claim 10, wherein the first, second, and third portions of the first semiconductor region are adjacent to the second semiconductor region and the drain contact region.

12. The semiconductor device of claim 11, wherein the drain contact region extends directly over the first, second, and third portions of the first semiconductor region.

13. The semiconductor device of claim 12, wherein the third portion of the first semiconductor region is adjacent to the first and second portions of the first semiconductor region.

14. The semiconductor device of claim 13, wherein the first dopant type is P-type and the second dopant type is N-type.

15. A method for constructing a semiconductor device comprising:
forming a first semiconductor region in an epitaxial layer on a semiconductor substrate, the first semiconductor region having a plurality of first portions and second portions that are laterally adjacent to the first portions, the first portions having a first thickness and the second portions having a second thickness that is greater than the first thickness, the semiconductor substrate having a first dopant type and the first semiconductor region having first concentration of a second dopant type;

forming a plurality of second semiconductor regions within the epitaxial layer, each second semiconductor region being positioned directly below one of the first portions of the first semiconductor region and laterally between a respective pair of the second portions of the first semiconductor region;

forming a contact region within and at a surface of the epitaxial layer and adjacent to the first semiconductor region, the contact region having a second concentration of the second dopant type, the second concentration being substantially different than the first concentration;

forming a third semiconductor region within the epitaxial layer the third semiconductor region having a first dopant type; and forming a gate electrode over at least a portion of the first semiconductor region and at least a portion of the third semiconductor region, wherein the first semiconductor region covers the plurality of the second semiconductor regions to form a buried super-junction.

16. The method of claim 15, wherein each respective first portion of the first semiconductor region is positioned laterally between and is adjacent to the respective pair of the second portions of the first semiconductor region.

17. The method of claim 16, wherein each second semiconductor region is adjacent to the respective first portion of the first semiconductor region and the respective pair of the second portions of the first semiconductor region.

18. The method of claim 15 wherein the contact region is a drain contact region over at least some of the first and second portions of the first semiconductor region and the respective second semiconductor regions and further comprising forming a source contact region within the semiconductor substrate and adjacent to the third semiconductor region, the source contact region having the second dopant type.

19. The method of claim 18, wherein the first dopant type is P-type and the second dopant type is N-type.

* * * * *